United States Patent
Soininen et al.

(10) Patent No.: US 9,803,281 B2
(45) Date of Patent: Oct. 31, 2017

(54) NOZZLE HEAD AND APPARATUS

(75) Inventors: Pekka Soininen, Helsinki (FI); Olli Pekonen, Espoo (FI)

(73) Assignee: BENEQ Oy, Vantaa (FI)

( * ) Notice: Subject to any disclaimer, the term of this patent is extended or adjusted under 35 U.S.C. 154(b) by 0 days.

(21) Appl. No.: 13/817,977

(22) PCT Filed: Aug. 29, 2011

(86) PCT No.: PCT/FI2011/050748
§ 371 (c)(1),
(2), (4) Date: Feb. 20, 2013

(87) PCT Pub. No.: WO2012/028780
PCT Pub. Date: Mar. 8, 2012

(65) Prior Publication Data
US 2013/0149446 A1    Jun. 13, 2013

(30) Foreign Application Priority Data
Aug. 30, 2010 (FI) .................................... 20105905

(51) Int. Cl.
*C23C 16/455* (2006.01)
*C23C 16/54* (2006.01)

(52) U.S. Cl.
CPC .. *C23C 16/45563* (2013.01); *C23C 16/45551* (2013.01); *C23C 16/545* (2013.01)

(58) Field of Classification Search
CPC ............ C23C 16/45563; C23C 16/545; C23C 16/45551
USPC ....................... 118/715; 156/345.1
See application file for complete search history.

(56) References Cited

U.S. PATENT DOCUMENTS

| | | | |
|---|---|---|---|
| 5,462,899 A * | 10/1995 | Ikeda ............................ | 438/790 |
| 7,850,780 B2 * | 12/2010 | Levy et al. ................... | 118/715 |
| 2003/0113451 A1 * | 6/2003 | Mayer et al. ............ | 427/255.28 |
| 2004/0231588 A1 | 11/2004 | Mayer et al. | |

(Continued)

FOREIGN PATENT DOCUMENTS

| CN | 1424429 A | 6/2003 |
|---|---|---|
| KR | 20090116020 A | 11/2009 |

(Continued)

OTHER PUBLICATIONS

Jun. 16, 2014 Office Action issued in Chinese Patent Application No. 201180041752.7 (with English translation).

(Continued)

*Primary Examiner* — Rudy Zervigon
(74) *Attorney, Agent, or Firm* — BelayIP Oy

(57) ABSTRACT

Described herein is an apparatus and nozzle head for coating a surface of a substrate. The apparatus comprising a process chamber having inside a gas atmosphere, a nozzle head arranged inside the process chamber, precursor supply and discharge means. The nozzle head including one or more first precursor nozzles for subjecting the surface of the substrate to the first precursor, one or more second precursor nozzles for subjecting the surface of the substrate to the second precursor and one or more purge gas channels between the first and second precursor zones. In certain aspects, the purge gas channel is at least partly open to the gas atmosphere comprising purge gas for subjecting the surface of the substrate to purge gas.

28 Claims, 5 Drawing Sheets

(56) References Cited

U.S. PATENT DOCUMENTS

| | | | |
|---|---|---|---|
| 2005/0172897 A1 | 8/2005 | Jansen | |
| 2007/0281089 A1 | 12/2007 | Heller et al. | |
| 2008/0213504 A1* | 9/2008 | Ishikawa | C23C 16/45565 427/569 |
| 2010/0189900 A1 | 7/2010 | Dickey et al. | |
| 2011/0086167 A1 | 4/2011 | Nunes et al. | |

FOREIGN PATENT DOCUMENTS

| | | |
|---|---|---|
| TW | 200930834 A | 7/2009 |
| TW | 201200619 A | 1/2012 |

OTHER PUBLICATIONS

May 27, 2005 Search Report issued in Finnish Patent Application No. 20105905 (with translation).
Dec. 22, 2011 Search Report issued in International Patent Application No. PCT/FI2011/050748.
Dec. 22, 2011 Written Opinion issued in International Patent Application No. PCT/FI2011/050748.
May 27, 2016 Office Action issued in Taiwanese Patent Application No. 100130880.
May 27, 2016 Search Report issued in Taiwanese Patent Application No. 100130880.

* cited by examiner

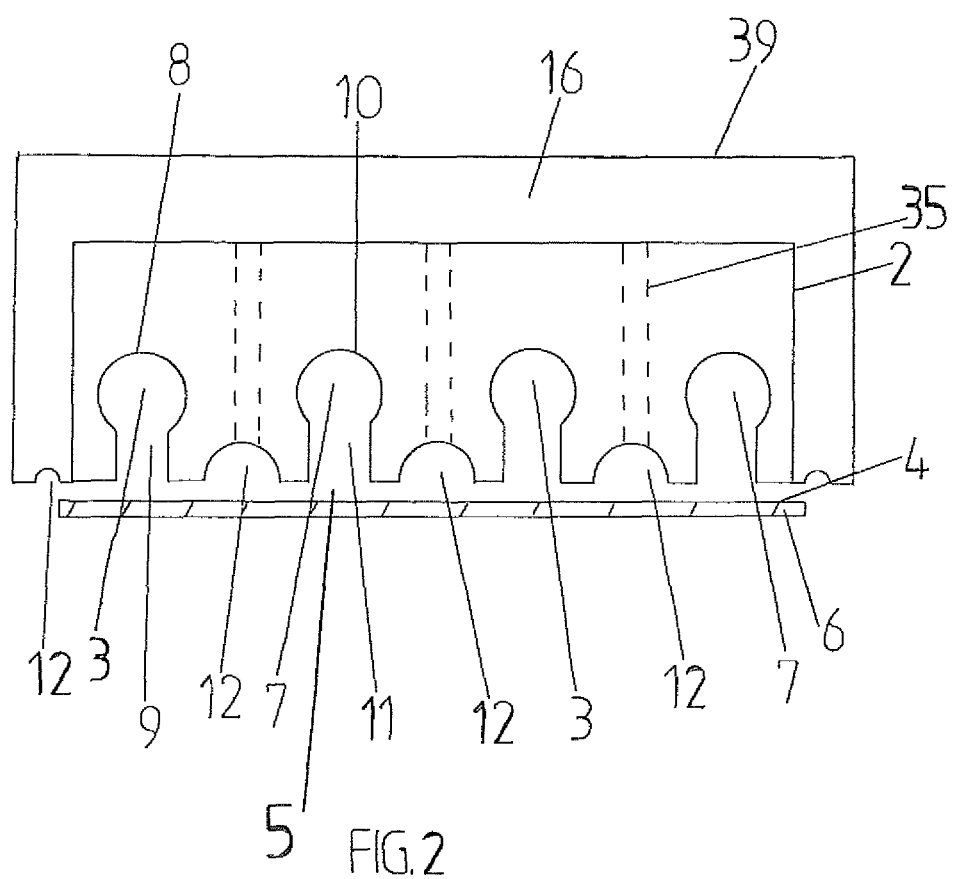

NOZZLE HEAD AND APPARATUS

BACKGROUND OF THE INVENTION

The present invention relates to a nozzle head for subjecting a surface of a substrate to successive surface reactions of at least a first precursor and a second precursor, and particularly to a nozzle head according to the preamble of claim 1. The present invention further relates to a an apparatus comprising a nozzle head for subjecting a surface of a substrate to successive surface reactions of at least a first precursor and a second precursor, and particularly to an apparatus according to the preamble of claim 17. The present invention also relates to a method for subjecting a surface of a substrate to successive surface reactions of at least a first precursor and a second precursor, and particularly to a method according to the preamble of claim 25.

In the prior art several types of apparatuses, nozzle heads and nozzles are used for subjecting a surface of a substrate to successive surface reactions of at least a first precursor and a second precursor according to the principles of atomic layer deposition method (ALD). In ALD applications, typically two gaseous precursors are introduced into the ALD reactor in separate stages. The gaseous precursors effectively react with the substrate surface, resulting in deposition of a growth layer. The precursor stages are typically followed or separated by an inert-gas purge stage that eliminates the excess precursor from the surface of the substrate prior to the separate introduction of the other precursor. Therefore an ALD process requires alternating in sequence the flux of precursors to the surface of the substrate. This repeated sequence of alternating surface reactions and purge stages between is a typical ALD deposition cycle.

The prior art apparatuses for continuously operating ALD usually comprise a nozzle head having one or more first precursor nozzles for subjecting the surface of the substrate to the first precursor, one or more second precursor nozzles for subjecting the surface of the substrate to the second precursor, one or more purge gas channels and one or more discharge channels for discharging both precursors and purge gas arranged in the following order: at least a first precursor nozzle, a first discharge channel, purge gas channel, a discharge channel, a second precursor nozzle, a discharge channel, a purge gas channel and a discharge channel, optionally repeated a plurality of times. The problem with this prior art nozzle head is that it comprises several different nozzles and channels which makes the nozzle head complicated and rather large. The nozzle is preferably moved in relation to the substrate for producing a number of growth layers.

Another type of prior art nozzle head for continuous ALD comprises alternatively in succession: a first precursor nozzle, a purge gas channel, a second precursor nozzle and purge gas channel, optionally repeated a plurality of times. In this prior art nozzle head each of the precursor nozzles and purge gas channels is provided with an inlet port and an outlet port such that the precursor and the purge gas is both supplied and discharged using the same nozzle. Therefore there are no separate discharge channels. The problem with this prior art nozzle head is that purge gas will leak to the precursor nozzle such that the precursor concentration will dilute. Thus the nozzle head is unable to provide a uniform gas supply over the whole length of the precursor nozzle or over the whole output face of the nozzle head. Furthermore the construction is complicated as there are inlet port and outlet port in each of the nozzles. Also this nozzle head may be moved relative to the substrate for producing a number of growth layers.

BRIEF DESCRIPTION OF THE INVENTION

Thus the object of the present invention is to provide a nozzle head and an apparatus such that the above mentioned prior art problems are solved. The objects of the present invention are achieved with a nozzle head according to the characterizing part of claim 1, characterized in that the one or more purge gas channels are arranged in fluid connection with a gas atmosphere surrounding the nozzle head and comprising purge gas. The objects of the present invention are further achieved with an apparatus according to the characterizing portion of claim 17, characterized in that the purge gas channel is in fluid connection with the gas atmosphere inside the process chamber for subjecting the surface of the substrate to purge gas. The objects of the present invention are further achieved with a method according to the characterizing portion of claim 25.

The preferred embodiments of the present invention are described in dependent claims.

The present invention is based on the idea of using a static purge gas container or reservoir surrounding the nozzle head for subjecting a surface of a substrate to purge gas between the precursors. According to the present invention there is provided a purge gas atmosphere and the purge gas channels of the nozzle head are in passive fluid connection with purge gas atmosphere. Passive fluid connection means that purge gas is not supplied to the purge gas channel using active means such as pumps, but the purge gas channel is connected to the same pressure medium with purge gas atmosphere, such that purge gas may flow to the purge gas channel. According to the present invention the purge gas channels are in fluid connection with the gas atmosphere surrounding the nozzle head. This embodiment enables the nozzle head to be constructed such that there are provided gaps or openings between the first and second precursor nozzles, the gaps or openings being at least partly open to the gas atmosphere surrounding the nozzle head and to the output face of the nozzle head. In a preferred embodiment the first precursor nozzles are arranged to operate at a first pressure at the output face and the second precursor nozzles are arranged to operate at a second pressure at the output face, and that the purge gas atmosphere or the gas atmosphere surrounding the nozzle head is arranged to a third pressure higher than the first and second pressure. The first and second pressure may be different or substantially identical. This enables the purge gas from the purge nozzle or purge zone to separate the first and second precursor nozzles from each other. Additionally the purge gas may be at least partly exhausted through the outlet ports or discharges of the precursor nozzles. Accordingly in the present invention the precursor nozzles are provided with discharges arranged to discharge both precursors and purge gas.

The present invention has the advantage that there is no need for conventional purge gas channels, which are arranged to actively supply purge in the same way as the precursor nozzles. The structure of the nozzle head becomes simpler as the purge gas channels may be replaced by gaps or opening or passive purge gas channels arranged in fluid connection with the separate gas atmosphere or the gas atmosphere surrounding the nozzle head. The present invention further has the advantage that the purge gas channel or nozzle may be constructed narrower than in the prior art.

BRIEF DESCRIPTION OF THE FIGURES

In the following the invention will be described in greater detail, in connection with preferred embodiments, with reference to the attached drawings, in which FIG. 1A a schematic cross sectional view of an embodiment of a nozzle head;

FIG. 2 is a schematic cross sectional view another embodiment of a nozzle head;

DETAILED DESCRIPTION OF THE INVENTION

Figure 1A:
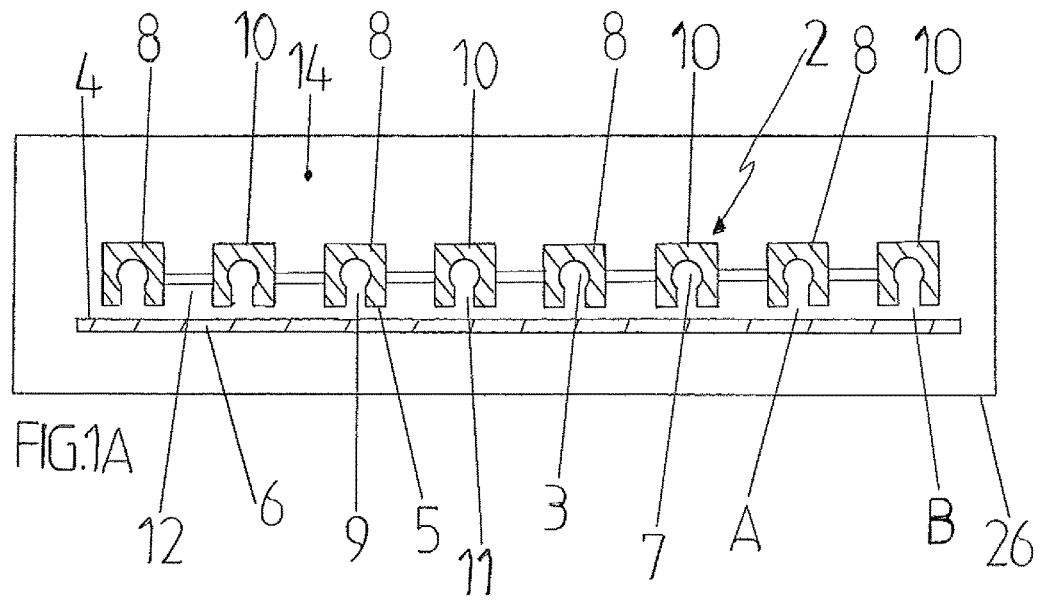
FIG. 1B is a top view of the nozzle head of the apparatus of FIG. 1A.

FIG. 1 shows a cross sectional view of one embodiment of an apparatus for subjecting a surface 4 of a substrate 6 to successive surface reactions of at least a first precursor A and a second precursor B according to the principles of ALD. The first and second precursors A and B may be any gaseous precursors used in ALD, such as ozone, TMA (trimethylaluminium), water, $TiCl_4$, DEZ (diethylzinc), or precursor may also be plasma, such as $NH_3$, Ar, $O_2$, $N_2$, $H_2$ or $CO_2$ plasma. The apparatus comprises a process chamber 26 having inside a gas atmosphere 14. The gas atmosphere 14 may comprise inert gas, such as nitrogen, or dry air, or any other gas suitable to be used as purge gas in ALD method. Also plasma may be used for purging, for example nitrogen or argon plasma. In that this context purge gas comprises also plasma. The purge gas source is connected to process chamber 36 for supplying purge gas into the process chamber 26. A nozzle head 2 is arranged inside the process chamber 26. The nozzle head comprises an output face 5, one or more first precursor nozzles 8 for subjecting the surface 4 of the substrate 6 to the first precursor A and one or more second precursor nozzles 10 for subjecting the surface 4 of the substrate 6 to the second precursor B. The apparatus further comprises means for supplying the first and second precursor A, B to the nozzle head 2 as well as means for discharging the first and second precursor A, B from the nozzle head 2. As shown in FIG. 1A, the first and second nozzles are arranged alternatively is succession for subjecting the surface 4 of the substrate 6 to alternative surface reactions of the first precursor A and second precursor B as the substrate 6 and the nozzle head 2 move relative to each other. The apparatus may be provided such that the nozzle head 2 may be moved, for example back and forth, and the substrate 2 is stationary. Alternatively the nozzle head 2 is static and the substrate 6 is moved or also the both substrate 6 and the nozzle head 2 may be moved. The substrate 6 may be a separate substrate loaded into the process chamber and processed by batch processing or alternative substrates may be arranged to be transported through the process chamber 26. The apparatus may also be constructed for roll to roll—process such that a flexible substrate is transported from one roll through the process chamber 26 to another roll, or from any source through the process chamber 26 to any receptacle, and processed with the nozzle head 2 inside the process chamber 26.

Figure 1B:
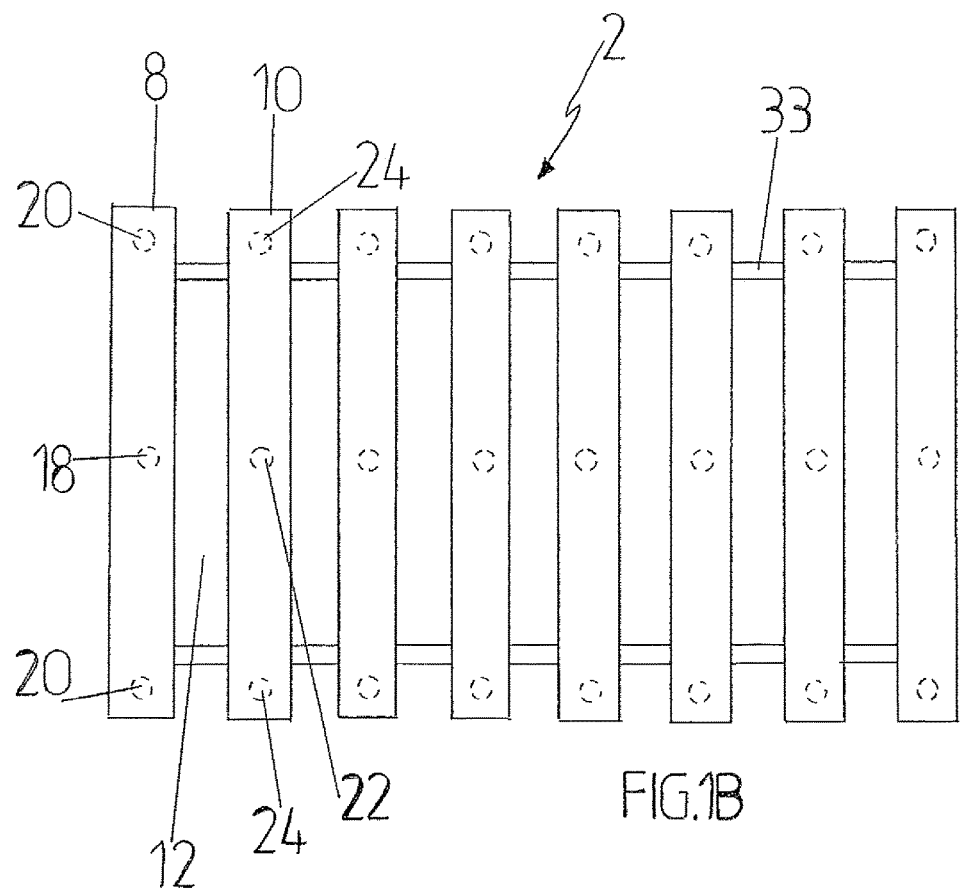

The precursor nozzles 8, 10 are preferably elongated. The first precursor nozzle 8 is provided with a first channel 3 extending the longitudinal direction of the first precursor nozzle 8 and comprising a first open portion 9 extending along the first channel 3 and open to the output face 5 of the nozzle head 2. The second precursor nozzle 10 is provided with a second channel 7 extending the longitudinal direction of the second precursor nozzle 10 and comprising a second open portion 11 extending along the second channel 7 and open to the output face 5 of the nozzle head 2. As shown in FIG. 1B the first precursor nozzle 8 comprises a first inlet port 18 for supplying first precursor A to the first channel 3 and two first outlet ports 20 for exhausting the second precursor from the first channel 3 after the surface reactions of the first precursor A. Similarly the second precursor nozzle 10 comprises a second inlet port 22 for supplying second precursor B to the second channel 7 and two second outlet ports 24 for exhausting the second precursor from the second channel 7 after the surface reactions of the second precursor B. In this embodiment the inlet ports 18, 22 are arranged in the middle of the length of the first and second channel 3, 7 and the outlet ports 20, 24 are arranged to the opposite ends of the first and second channel 3, 7, as shown in FIG. 1B. However, it should be noted that there may also be two or more inlet ports 18, 22 and one or more outlet ports 20, 24 in the first and second channel 3, 7. The inlet ports 18, 22 and the outlet ports 20, 24 may also be situated in any other position in the first and second channel 3, 7.

As shown in FIGS. 1A and 1B, the first and second nozzles 8, 10 are separated from each other by purge gas channels 12 open to the gas atmosphere 14 surrounding the nozzle head 2 in the process chamber 26 and to the output face 5 of the nozzle head 2. The purge gas channels 12 are formed as gaps extending between the first and second precursor nozzles 8, 10. The gaps 12 thus provide a fluid connection to the gas atmosphere 14 comprising purge gas. The gaps form a purge gas channel 12 between the first and second precursor nozzles 8, 10 for separating the first and second nozzles 8, 10 and first and second precursors A, B from each other. In FIGS. 1A and 1B the nozzle head 2 is provided as a grate-like structure in which the first and second precursor nozzles 8, 10 form the rods and the purge gas channels 12 form the gaps between the rods. The precursor nozzles 8, 10 are engaged to one another by connectors 33. However it should be noted that the purge gas channel 12 may also be provided by one or more channels, holes or conduits having a passive fluid connection to the gas atmosphere 14 or at least partly open to the gas atmosphere 14. These channels may be similar to first and second channels 3, 7.

In a preferred embodiment the first precursor nozzles 8 are arranged to operate at a first pressure at the output face 5, and the second precursor nozzles 10 are arranged to operate at a second pressure at the output face 5. The gas atmosphere 14 is provided to a third pressure higher than the first and second pressure. Thus the purge gas in the gas atmosphere 14 flows to the purge gas channel 12 and keeps the first and second precursor A, B separated. Some purge gas will also flow to the first and second channels 3, 7 from the purge gas channel between the output face 5 of the nozzle head 2 and the surface 4 of the substrate 6. The first, second and third pressure may be lower than the normal air pressure (NTP; 1 bar, 0° C.), or substantially the same as the normal air pressure or higher than the normal air pressure or even at vacuum. The pressure differences of the nozzles and the atmosphere is the key factor. The first and second pressure are measured at the output face 5 of the nozzle head 2 and the pressure in the first and second channel may be different from the first and second pressure, normally higher than the first and second pressure.

FIG. 2 shows another embodiment of the nozzle head 2 in which nozzle head 2 is provided with a separate purge gas container 39 arranged around the nozzle head 2. The purge gas container 39 has a gas atmosphere 16 inside. In FIG. 2 the purge gas container 39 is arranged to the nozzle head 2 and the gas atmosphere inside the purge gas container comprises purge gas. In this embodiment the first and second precursor nozzles 8, 10 are similar to precursor nozzles of FIGS. 1A and 1B, therefore they are not described in detail. In FIG. 2 there is provided a purge gas channel 12 between the first and second precursor nozzles 8, 10 for subjecting the surface 4 of the substrate 6 to a purge gas and separating the first and second precursor A, B from each other. The purge gas channel 12 is a channel extending in parallel with first and second precursor nozzles 8, 10. The purge gas channels 12 are arranged in passive fluid connection to the gas atmosphere 16 of the purge gas container 39 though conduits 35 extending from the purge gas container 39 to the purge gas channel 12. A purge gas source may be connected to the purge gas container 39 for supplying purge gas into the purge gas container 39. The purge gas channel 12 may also be formed by one or more gaps, holes or openings in passive fluid connection to the purge gas container 39 and at least partly open to the output face 5 of the nozzle head 2. The edge areas of the output face 5 are further provided with additional purge gas channels 12, as shown in FIG. 2. These additional purge gas channels 12 separate the nozzle head 2 and particularly the output face 5 of the nozzle head from the ambient atmosphere such that the nozzle head 2 may also optionally be used in atmospheric pressure as precursor gases are prevented from flowing to the ambient atmosphere. The additional purge gas channels may be provided separately to every edge area of the output face or they can extend as rings on the edge area and around the whole output face 5.

Also in this embodiment the first precursor nozzles 8 are arranged to operate at a first pressure at the output face 5, and the second precursor nozzles 10 are arranged to operate at a second pressure at the output face 5. The purge gas container 39 is arranged to a third pressure higher than the first and second pressure in the same way as in embodiment of FIGS. 1A and 1B. The first and second nozzles 8, 10 may also be operated in similar pressures as described in connection to FIGS. 1A and 1B. As the third pressure is higher than the first and second pressure the purge gas container provides a static supply of purge gas to the purge gas channels 12. Furthermore it should be noted that the nozzle head 2 of FIG. 2 may also be constructed such that the purge gas channels 12 are in fluid connection with the gas atmosphere 14 surround the nozzle head 2. Then the conduits 35 may be connected to the gas atmosphere 14 instead of purge gas container 39. The precursors and purge gas may be supplied to the nozzle head 2 via fluid connections. Alternatively the nozzle head 2 is provided with one or more precursor and/or purge gas containers, bottles or the like such that the precursors and/or the move together with the nozzle if the nozzle head is moved. This arrangement decreases the number of difficult fluid connections to a moving nozzle head 2.

The invention of FIGS. 1A, 1B and 2 may also be constructed using any kind of precursor nozzles and purge gas channels. The purge gas channels may be formed by two or more separate holes, openings or any kind of features providing a fluid connection to the gas atmosphere 14 or a separate purge gas container 39. The embodiment of FIGS. 1A, 1B and 2 enables purge gas to be used to separate precursor nozzles from each other without actively supplying purge gas and using a same kind of nozzle structure as the precursor nozzles 8, 10.

A prior art way of constructing a nozzle head of FIG. 2 is to provide a first precursor nozzle having at least one first inlet port and at least one first outlet port, a second precursor nozzle having at least one second inlet port and at least one second outlet port, and a purge gas channel between the first and second precursor nozzles, the purge gas channel having only one or more third inlet ports and no outlet ports. These three nozzle are repeated one or more times to form a nozzle head. The purge gas supplied to the purge gas channel from third inlet ports is discharge through first and second outlet ports of the first and second precursor nozzles.

Figure 3:
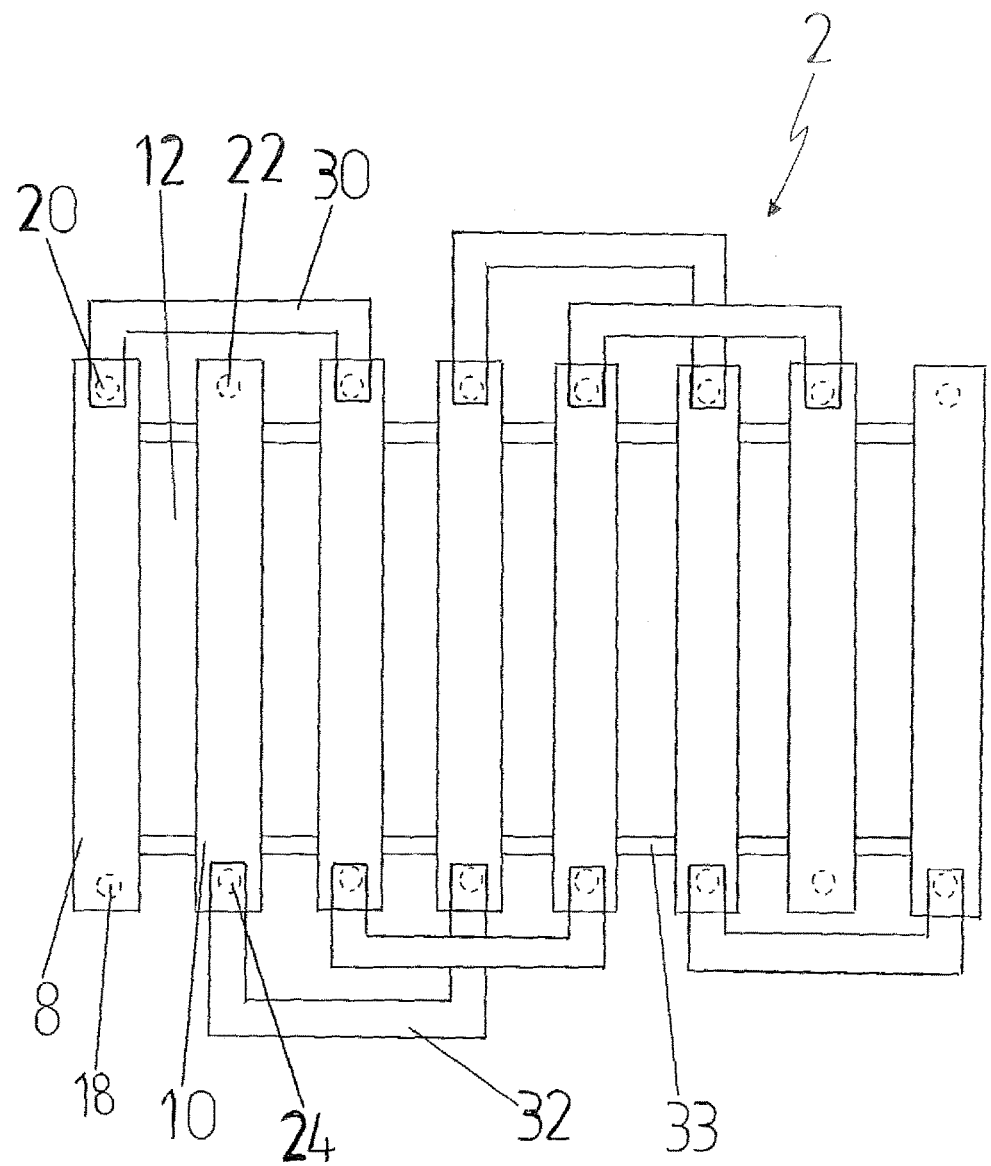
FIG. 3 is a schematic top view of yet another embodiment of a nozzle head of FIG. 1A.

FIG. 3 shows another embodiment in which the nozzle head 2 has the same kind of structure as the nozzle head of FIGS. 1A and 1B. It should be noted that the nozzle head may also be constructed in some other way than in FIG. 3. The nozzle head 2 comprises two or more first precursor nozzles 8 for subjecting the surface of the substrate to the first precursor A and two or more second precursor nozzles 10 for subjecting the surface 4 of the substrate 6 to the second precursor B. The first precursor nozzle 8 comprises at least one first inlet port 18 for supplying the first precursor A and at least one first outlet port 20 for exhausting the first precursor A. In FIG. 3 the first precursor nozzle head 8 comprises one first inlet port 18 provided at one of the elongated first precursor nozzle 8 and one first discharge port 20 provided at the other end of the first precursor nozzle 8. Similarly the second precursor nozzle 10 comprises one second inlet port 22 provided at one of the elongated second precursor nozzle 10 for supplying the second precursor B and one second discharge port 24 provided at the other end of the second precursor nozzle 10 for exhausting the second precursor B. The inlet ports 18, 22 and the outlet ports 20, 24 may also be located in on other way, for example as in FIG. 1B, the there may be also two or more inlet ports and outlet ports in each nozzle 8, 10. Furthermore, as will be described later, the nozzle head may also be constructed such that the precursor nozzles 8, 10 do not comprise any outlet ports 20, 24, but the nozzle head is provided with one or more separate discharge channels.

In FIG. 3 the nozzle head 2 is provided with first connection elements 30 for conducting first precursor A from the one first precursor nozzle 8 to the one or more other first precursor nozzles 8. The nozzle head 2 is further provided with second connection elements 32 for conducting second precursor B from the one second precursor nozzle 10 to the one or more other second precursor nozzles 10. The connection elements 30, 32 preferably comprise a pipe, a piping, a closed channel or a conduit and any other necessary components for providing a fluid connection between the two or more first precursor nozzles 8 or two or more second precursor nozzles 10. As shown in FIG. 3 the first outlet port 20 of one first precursor nozzle 8 is connected the first inlet port 18 of another first precursor nozzle 8 with the first connection element 30 for conducting first precursor A from the one first precursor nozzle 8 to the other first precursor nozzle 8. Similarly the second outlet port 24 of one second precursor nozzle 10 is connected to the second inlet ports 22 of another second precursor nozzles 10 with the at least one second precursor nozzle 10 for conducting second precursor B from the one second precursor nozzle 10 to the another second precursor nozzle 10. According to the above mentioned the idea of this is to connect two or more precursor nozzles 8, 10 in series such that precursor may flow in succession through two or more precursor nozzles 8, 10.

It should be noted that the connection elements 30, 32 may also be arranged some other way than as shown in FIG. 3 in which each connection element 30, 32 is provided between two or more precursor nozzles 8 or 10. The first connection element 30 may be arranged between one first precursor nozzle 8 and two or more other first precursor nozzles 8 for conducting first precursor A from the one first precursor nozzle 8 to two or more other first precursor nozzles 8. Also the second connection element 32 may be arranged between one second precursor nozzle 10 and two or more other second precursor nozzles 10 for conducting second precursor B from the one second precursor nozzle 10 to two or more other second precursor nozzles 10.

The embodiment of FIG. 3 and as described above provides way for enhancing the material efficiency of the precursors A, B. When precursor A, B is supplied to a precursor nozzle 8, 10 some of the precursor A, B reacts of the surface 4 of the substrate 6, but usually an overdose of precursor A, B is supplied. Thus at least part of the precursor A, B supplied to the precursor channel 8, 10 does not react on the substrate 6 surface. In the prior art this excess precursor A, B is discharged as waste. The embodiment of FIG. 3 enables the excess precursor A, B to be used in some other precursor nozzle 8, 10. It should also be noted that the fluid connection with the connection element 30, 32 may be formed in different ways depending on the structure of the nozzle head 2. Furthermore, it should be noted that the there is a pressure drop when precursor is conducted from one precursor nozzle 8, 10 to another.

The first connection element 30 may be arranged between one or more first precursor nozzles 8 and at least another first precursor nozzle 8. Thus one first precursor nozzle 8 may be connected to several other first precursor nozzles 8, or several first precursor nozzles 8 may be connected to one other first precursor nozzles 8, or several first precursor nozzles 8 may be connected to several other first precursor nozzles 8 using the first connection elements 30. In one embodiment the nozzle head 2 comprises two or more first connection elements 30 between two first precursor nozzles 8. Thus precursor is conducted from one first precursor nozzle 8 to another first precursor nozzle 8 and the discharged. The nozzle head 2 may thus comprise two or more these together connected units of two first precursor nozzles 8. The second precursor nozzles 10 may be connected in the same way using the second connection elements 32.

Figure 4:
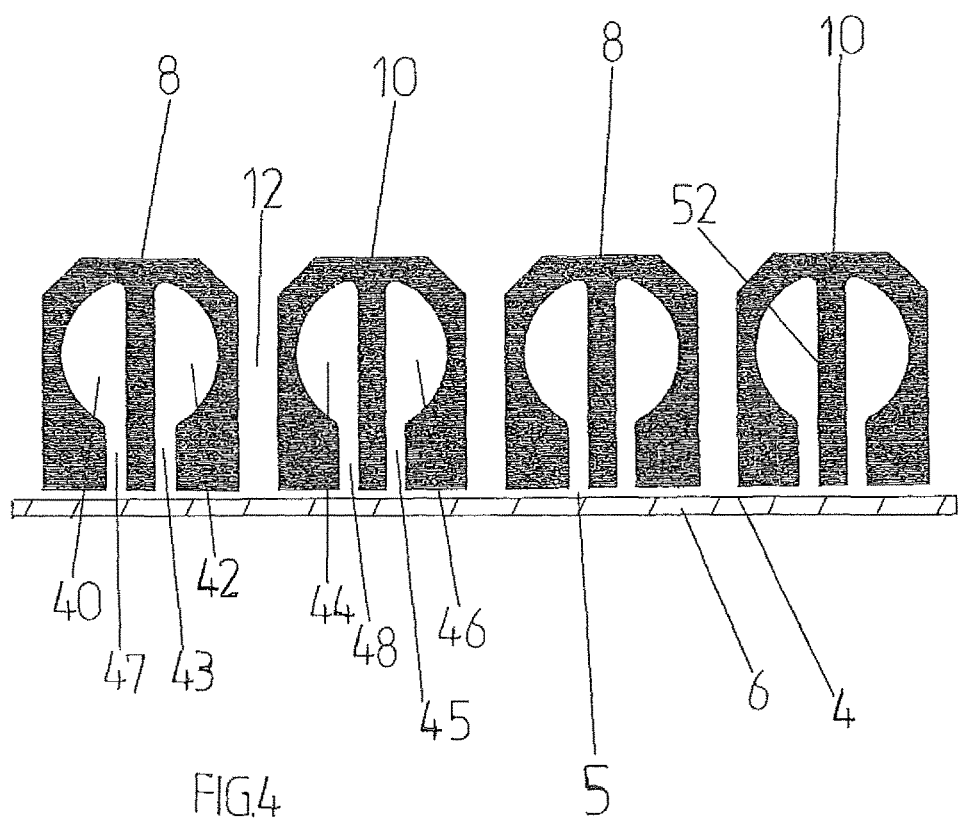
FIG. 4 shows a cross sectional view of still another embodiment of a nozzle head.

FIG. 4 shows a schematic view of one embodiment in which the nozzle head comprises first precursor nozzles 8, second precursor nozzles 10 and purge gas channels 12 provided between the elongated precursor nozzles 8, 10. The precursor nozzles 8, 10 comprise a supply channel 40, 44 extending in the longitudinal direction of the elongated precursor nozzle 8, 10. The precursor nozzles 8, 10 further comprises a discharge channel 42, 46 extending in the longitudinal direction of the elongated precursor nozzle 8, 10 substantially parallel and adjacent to the supply channel 40, 44 for discharging precursor A, B by using vacuum or suction. The first precursor nozzle 8 comprises a first supply channel 40 and a first discharge channel 42, while the second precursor nozzle 10 comprises a second supply channel 44 and a second discharge channel 46. Therefore, FIG. 4 shows an embodiment in which the supply channel 40, 44 and the discharge channel 42, 46 are provided to the same precursor nozzle 8, 10 and separated from each other by a partition wall 52. However, it should be noted that the discharge channels 42, 46 may also be formed as a separate structural part arranged between a precursor nozzle 8, 10 or supply channel 40, 44 and the purge gas channel 12.

The supply channel 40, 44 is provided with at least one inlet port for supplying precursor A, B through the output face 5 of the nozzle head 2. The inlet ports are preferable arranged such that precursor A, B may be supplied along the whole length of the supply channel 40, 44. Then the discharge channel 42, 46 is provided with at least one outlet port for discharging precursor A, B. The outlet ports are preferably arranged such that the precursor A, B may be discharged along the whole length of the discharge channel 42, 46. Therefore the inlet port and the outlet port may be a longitudinal opening extending along the supply channel 40, 44 and discharge channel 42, 46 respectively. Alternatively the supply channel 40, 44 and discharge channel 42, 46 may comprise series of inlet ports and outlet along the length of the supply channel 40, 44 and discharge channel 42, 46, respectively. As seen in FIG. 4 the supply channel 40, 44 and the discharge channel 42, 46 are at least partly open to the output face 5. The supply channel 40, 44 is provided with a supply opening 47, 48 extending the longitudinal direction of the supply channel 40, 44 and being open to the output face 5. Also the discharge channel 42, 46 is provided with a discharge opening 43, 45 extending the longitudinal direction of the discharge channel 42, 46 open the output face 5. The precursor nozzle 8, 10 or the supply channel 40, 44 is arranged to supply precursor A, B substantially perpendicularly to the output face 5, and precursor nozzle 8, 10 or the discharge channel 42, 46 is arranged to discharge precursor A, B substantially perpendicularly to the output face 5. This has the advantage that the perpendicular gas flow helps to break the gas layer on the substrate surface enhancing surface reactions of the precursors.

It should be noted that the embodiment of FIG. 4 may also be constructed such that the supply channel 40, 44 is part of the precursor nozzle 8, 10, but the discharge channel 42, 46 is a separate part. The basic idea is that the nozzle head 2 comprises on the output face 5 precursors nozzles 8, 10, purge gas channels 12 and the discharge channels 42, 46 in succession in the following order: at least a first precursor nozzle 8, a first discharge channel 42, purge gas channel 12, a second precursor nozzle 10, a second discharge channel 46 and a purge gas channel 12, optionally repeated a plurality of times. It is irrelevant if the supply channel 40, 44 and the discharge channel 42, 46 are provided to same structural part or not. The purge gas channel 12 may be provided in the same as in the embodiment of FIGS. 1A, 1B, 2 and 3 or the purge gas channels 12 may be provided with same kind of nozzles as the precursor nozzles 8, 10 or supply channels 40, 44. Thus the purge gas channel 12 may be arranged in passive fluid connection with a purge gas atmosphere 14, 16 for subjecting the surface 4 of the substrate 6 to a purge gas, as shown in FIGS. 1A, 1B and 2. The purge gas atmosphere is the gas atmosphere 14 surrounding the nozzle head 2 or a separate purge gas container 39. The one or more first precursor nozzles 8 is arranged to operate at a first pressure at the output face 5, and that the one or more second precursor nozzles 10 are arranged to operate at a second pressure at the output face 5, and that the purge gas atmosphere is arranged to a third pressure higher than the first and second pressure. The first and second pressures may also be measured at the output face 5 between the supply channel and the discharge channel in embodiment of FIG. 4.

Figure 5:
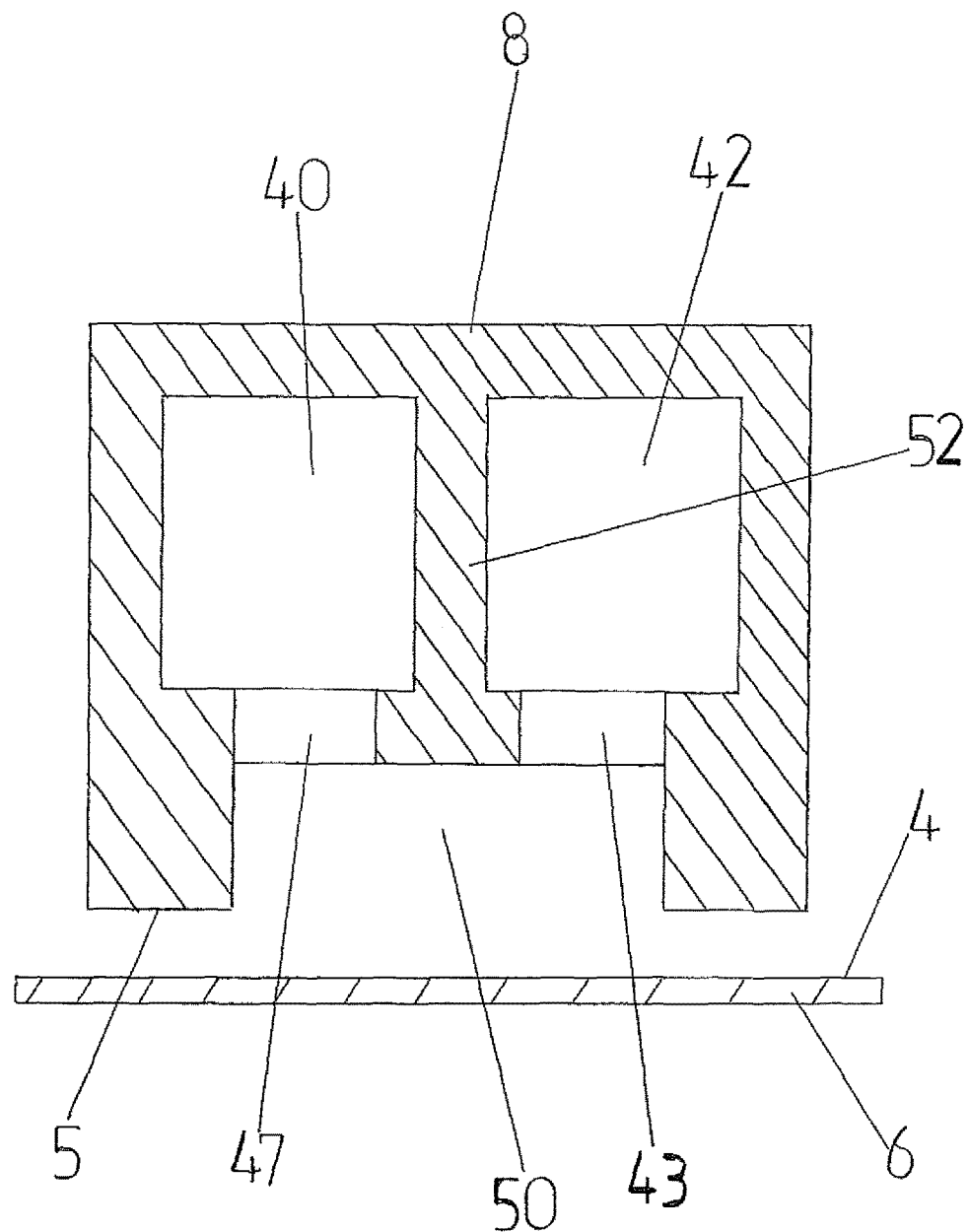
FIG. 5 shows a cross sectional view of one embodiment of a nozzle of a nozzle head.

FIG. 5 shows one embodiment in which the nozzle head 2 comprises a reaction space 50 provided between the supply channel 40, 44 and the discharge channel 42, 46. The reaction space 50 is open to the output face 5 for subjecting the surface 4 of the substrate 6 to precursor A, B. In FIG. 4 is shown a precursor nozzle similar to FIG. 4 in which the discharge channel 42, 46 is formed to the precursor nozzle 8. However, it should be noted that the reaction space 50 may also be provided between a precursor nozzle 8, 10 having only supply channel 40, 44 and a separate discharge channel 42, 46. The reaction space 50 is arranged between the supply channel 40, 44 and the discharge channel 42, 46. The reaction space 50 is arranged to extend substantially along the whole length of the supply channel 40, 44 and between the output face 5 and the supply and discharge channels 40, 44, 42, 46. The reaction space 50 is arranged such that precursor A, B is arranged to flow from the supply channel 40, 44 through the reaction space 50 to the discharge channel 42, 46 and the surface reactions of the precursors A, B take place at the reaction space 50.

The nozzle head 2 of FIG. 4 comprising on the output face 5 precursors nozzles 8, 10, purge gas channels 12 and the discharge channels 42, 46 in succession in the following order: at least a first precursor nozzle 8, a first discharge channel 42, purge gas channel 12, a second precursor nozzle 10, a second discharge channel 46 and a purge gas channel 12, optionally repeated one or more times, may be also constructed to comprise one or more connection elements 30, 32 shown in embodiment of FIG. 3. Thus the one or more first discharge channel 42 following one first precursor nozzle 8 or first supply channel 40 is connected to one or more other first precursor nozzle 8 or first supply channel 40 for conducting first precursor A to the one or more other first precursor nozzles 8 or first supply channels 40. Similarly the one or more second discharge channel 46 following one second precursor nozzle 10 or second supply channel 44 is connected to one or more other second precursor nozzle 10 or second supply channel 44 for conducting second precursor B to the one or more other second precursor nozzle 8 or second supply channel 44.

In the present invention the purge gas and the precursors are thus exhausted through the discharges provided to the precursor nozzles. Thus the precursors do not flow to the atmosphere around the nozzle head and the apparatus does not become contaminated by the excess precursors.

From the above description it should be evident that all the embodiment disclosed and shown in FIGS. 1A, 1B, 2, 3, 4 and may be combined It should be obvious to a person skilled in the art that as the technology advantages, the inventive concept can be implemented in variety of ways. The invention and its embodiments are not restricted to the above examples, but may vary within the scope of the claims.

The invention claimed is:

1. A nozzle head configured to subject a surface of a substrate to successive surface reactions of at least a first precursor and a second precursor, the nozzle head comprising:
an output face;
one or more first precursor nozzles for subjecting the surface of the substrate to the first precursor;
one or more second precursor nozzles for subjecting the surface of the substrate to the second precursor;
one or more purge gas channels arranged between the first and second precursor channels for subjecting the surface of the substrate to a purge gas, the one or more purge gas channels separating the first and second precursor nozzles;
one or more discharge ports provided to the first and second precursor nozzles for exhausting precursors; and
a purge gas container having a gas atmosphere inside, the purge gas container being arranged around the nozzle head, wherein:
the one or more purge gas channels are arranged in passive fluid connection with a gas atmosphere surrounding the nozzle head and including purge gas,
the first precursor nozzle is arranged to supply only the first precursor, the second precursor nozzle is arranged to supply only the second precursor, and the purge gas channel is arranged in passive fluid connection to the gas atmosphere of the purge gas container through conduits extending from the purge gas container to the purge gas channel for allowing purge gas to flow from the purge gas atmosphere to the output face through the purge gas channel such that the purge gas channel separates the first and second precursors,
the purge gas channel is arranged to extend from the output face through the nozzle head,
the first precursor nozzle includes a first open portion open to the output face,
the second precursor nozzle includes a second open portion open to the output face, and
the first open portion of the first precursor nozzle, the second open portion of the second precursor nozzle and the outlet of the purge gas channel are arranged on the same plane on the output face.

2. The nozzle head according to claim 1, wherein the nozzle head comprises a purge gas container surrounding the nozzle head and comprising the gas atmosphere having purge gas.

3. The nozzle head according to claim 2, wherein the purge gas channel is formed by one or more gaps, holes or openings at least partly open to the purge gas container.

4. The nozzle head according to claim 1, wherein the one or more first precursor nozzles are arranged to operate at a first pressure at the output face, and that the one or more second precursor nozzles are arranged to operate at a second pressure at the output face, and that the gas atmosphere is arranged to a third pressure higher than the first and second pressure.

5. The nozzle head according to claim 4, wherein the first, second and third pressures are lower than the normal air pressure or at vacuum.

6. The nozzle head according to claim 4, wherein the third pressure is substantially normal air pressure.

7. The nozzle head according to claim 1, wherein the discharge is arranged to exhaust precursors and purge gas from the surface of the substrate.

8. The nozzle head according to claim 1, wherein the first and second precursor nozzles are arranged alternatively adjacent to each other and a purge gas channel is arranged between each first and second precursor nozzle.

9. The nozzle head according to claim 1, wherein the precursor nozzles comprise elongated supply channels having open portion extending along the supply channels and open to the output face of the nozzle head.

10. The nozzle head according to claim 1, wherein the first precursor nozzle is provided with at least one first inlet port for supplying the first precursor and with at least one first outlet port for exhausting the first precursor, and that the second precursor nozzle is provided with at least one second inlet port for supplying the second precursor and with at least one second outlet port for exhausting the second precursor.

11. The nozzle head according to claim 9, wherein the precursor nozzles are provided with discharge channels provided with a supply opening extending the longitudinal direction of the supply channel and being open to the output face.

12. The nozzle head according to claim 11, wherein the discharge channel extend substantially parallel and adjacent to the supply channel.

13. The nozzle head according to claim 11, wherein the nozzle head comprises on the output face supply channels, purge gas channel and the discharge channels in succession in the following order: at least a first precursor nozzle, a first discharge channel, purge gas channel, a second precursor nozzle, a second discharge channel and a purge gas channel, optionally repeated a plurality of times.

14. The nozzle head according to claim 1, wherein the purge gas channel is an elongated channel having on the output face an open portion extending the longitudinal direction of the precursor nozzles and a fluid connection to a gas atmosphere.

15. The nozzle head according to claim 1, wherein the nozzle head is a grate-like structure in which the first and second precursor nozzles form the rods and the purge gas channels form the gaps between the rods.

16. The nozzle head according to claim 1, wherein the nozzle head comprises at least one first connection element for conducting first precursor from one or more first precursor nozzles to one or more other first precursor nozzles.

17. An apparatus for processing a surface of a substrate, the apparatus comprising:
a process chamber having inside a gas atmosphere;
a nozzle head arranged inside the process chamber such that the process chamber is arranged around the nozzle head for subjecting the surface of the substrate to successive surface reactions of at least a first precursor and a second precursor,
the nozzle head having an output face and comprising:
one or more first precursor nozzles for subjecting the surface of the substrate to the first precursor, the one or more first precursor nozzles being configured to supply only the first precursor;
one or more second precursor nozzles for subjecting the surface of the substrate to the second precursor, the one or more second precursor nozzles being configured to supply only the second precursor;
one or more discharge ports provided to the first and second precursor nozzles for exhausting precursors; and
one or more purge gas channels between the first and second precursor nozzles, wherein:
the one or more first and second precursor nozzles are separated from each other by the one or more purge gas channels extending between the process chamber and the output face of the nozzle head such that the one or more purge gas channels are open to: (i) the gas atmosphere in the process chamber, and (ii) the output face of the nozzle head, thereby providing a passive fluid connection between the one or more purge gas channels and the gas atmosphere inside the process chamber for subjecting the surface of the substrate to purge gas from the process chamber through the one or more purge gas channels to the output face of the nozzle head,
the first precursor nozzle includes a first open portion open to the output face,
the second precursor nozzle includes a second open portion open to the output face, and
the first open portion of the first precursor nozzle, the second open portion of the second precursor nozzle and the outlet of the purge gas channel are arranged on the same plane on the output face.

18. The apparatus according to claim 17, wherein the one or more first precursor nozzles are arranged to operate at a first pressure at the output face, and that the one or more second precursor nozzles are arranged to operate at a second pressure at the output face, and that the gas atmosphere is provided to a third pressure higher than the first and second pressure.

19. The apparatus according to claim 18, wherein the first, second and third pressures are lower than the normal air pressure.

20. The apparatus according to claim 18, wherein the third pressure is substantially normal air pressure.

21. The apparatus according to claim 17, wherein the purge gas channel is formed as one or more holes, gaps or openings between the first and second precursor nozzle and open to the output face and in fluid connection to the gas atmosphere.

22. The apparatus according to claim 21, wherein the one or more holes, gaps or openings is arranged to extend from the gas atmosphere to the output face.

23. The apparatus according to claim 17, wherein the discharge is arranged to exhaust precursors and purge gas from the surface of the substrate.

24. The apparatus according to claim 17, wherein nozzle head is arranged to be moved in relation to the surface of the substrate.

25. A method for processing a surface of a substrate with an apparatus comprising a process chamber having inside a gas atmosphere and a nozzle head inside the process chamber, the nozzle head including: (i) one or more first precursor nozzles, (ii) one or more second precursor nozzles, and (iii) an output face, the method comprising:
supplying a first precursor via only the first precursor nozzle for subjecting the surface of the substrate to the first precursor;
supplying a second precursor via only the second precursor nozzle for subjecting the surface of the substrate to the second precursor;
subjecting the surface of the substrate to purge gas between the first and second precursors; and
exhausting precursors and purge gas through the precursor nozzles,
wherein the surface of the substrate is subjected to purge gas by providing purge gas passively from the process chamber having inside the gas atmosphere including purge gas provided through a purge gas channel and through the output face to the surface of the substrate,
the first precursor nozzle includes a first open portion open to the output face,
the second precursor nozzle includes a second open portion open to the output face, and
the first open portion of the first precursor nozzle, the second open portion of the second precursor nozzle and the outlet of the purge gas channel are arranged on the same plane on the output face.

26. The method according to claim 25, wherein a purge gas is supplied to the atmosphere surrounding the nozzle head.

27. The method according to claim 25, wherein a purge gas is supplied into a process chamber inside which the nozzle is arranged.

28. The method according to claim 25, wherein a passive fluid connection is provided between the surface of the substrate and the gas atmosphere.

\* \* \* \* \*